United States Patent
Hoya et al.

(10) Patent No.: US 8,324,321 B2
(45) Date of Patent: *Dec. 4, 2012

(54) THERMOPLASTIC RESIN COMPOSITION, A SOLAR CELL SEALING SHEET, AND A SOLAR CELL

(75) Inventors: Hiroshi Hoya, Chiba (JP); Kiminori Noda, Mobara (JP)

(73) Assignee: Mitsui Chemicals, Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/294,036

(22) Filed: Nov. 10, 2011

(65) Prior Publication Data

US 2012/0053298 A1    Mar. 1, 2012

Related U.S. Application Data

(62) Division of application No. 11/783,891, filed on Apr. 12, 2007, now Pat. No. 8,067,499.

(30) Foreign Application Priority Data

Apr. 13, 2006   (JP) .................................. 2006-111069

(51) Int. Cl.
*C08F 8/00* (2006.01)
*C08L 23/04* (2006.01)

(52) U.S. Cl. .......................... 525/191; 525/194; 525/240

(58) Field of Classification Search .................. 525/191, 525/194, 240
See application file for complete search history.

(56) References Cited

U.S. PATENT DOCUMENTS

| | | | |
|---|---|---|---|
| 6,335,479 B1 | 1/2002 | Yamada et al. | |
| 7,105,603 B2 | 9/2006 | Dharmarajan et al. | |
| 2009/0044853 A1 | 2/2009 | Hoya et al. | |

FOREIGN PATENT DOCUMENTS

| | | |
|---|---|---|
| EP | 1 741 747 A1 | 1/2007 |
| JP | 08-283696 | 10/1996 |
| JP | 11-163377 | 6/1999 |
| JP | 2000-91611 | 3/2000 |
| JP | 2000-183386 | 6/2000 |
| JP | 2001-089616 | 4/2001 |
| JP | 2001-332751 | 11/2001 |
| JP | 2005-19975 | 1/2005 |
| JP | 2006-36875 | 2/2006 |
| WO | WO 2006/057361 | 6/2006 |
| WO | WO 2006/070793 A1 | 7/2006 |
| WO | WO 2006/098452 A1 | 9/2006 |

OTHER PUBLICATIONS

Office Action in U.S. Appl. No. 12/974,386 dated Mar. 21, 2011.
European Search Report dated in Nov. 15, 2010 for European Application No. 07741470.4 (5 pgs).

*Primary Examiner* — Nathan M Nutter
(74) *Attorney, Agent, or Firm* — Foley & Lardner LLP

(57) ABSTRACT

The present invention provides a thermoplastic resin composition that gives a solar cell sealing sheet having, even without being crosslinked, good mechanical strength, solar cell sealability, transparency, and weatherability.

The thermoplastic resin composition of the present invention comprises 1 to 95% by weight of a propylene-based polymer (A) and 5 to 99% by weight of a copolymer (B) with at least one •-olefin having 2 to 20 carbon atoms other than propylene, wherein (A) satisfies the following (i) and (ii), and (B) has a melting point below 80° C. or does not show a melting point as measured by a differential scanning calorimeter (DSC). (i) Melting point measured by a differential scanning calorimeter (DSC) method is in the range of 80 to 135° C. (ii) Endotherm attributable to crystal melting is not observed at 140° C. or more in the endothermic curve measured by a differential scanning calorimeter (DSC) method.

4 Claims, 3 Drawing Sheets

[Figure 1]
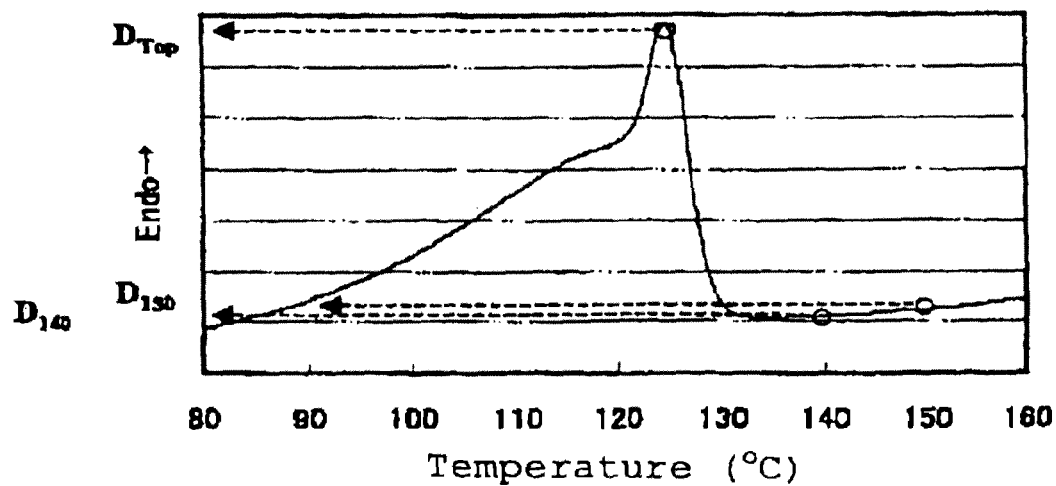
[Figure 2]
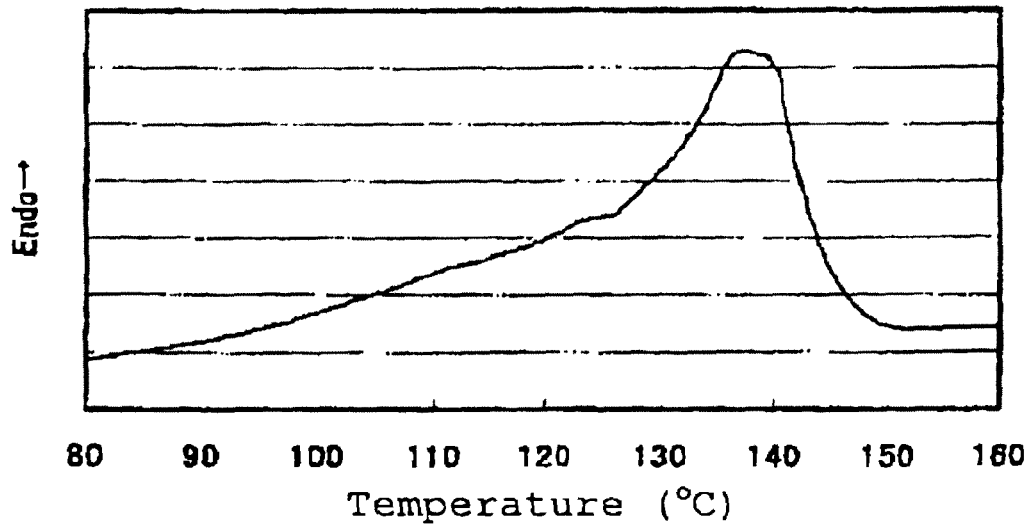

[Figure 3]
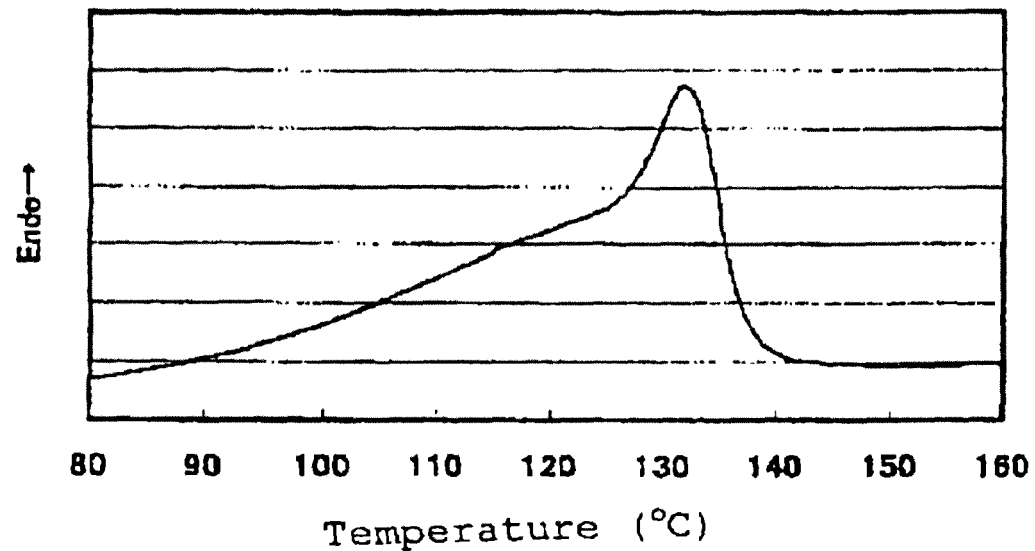
[Figure 4]
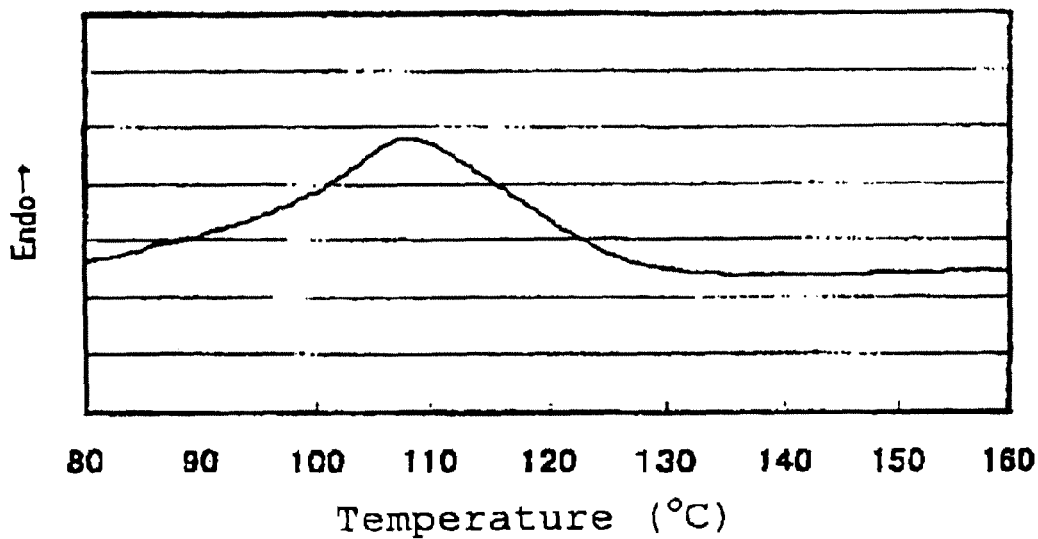

[Figure 5]
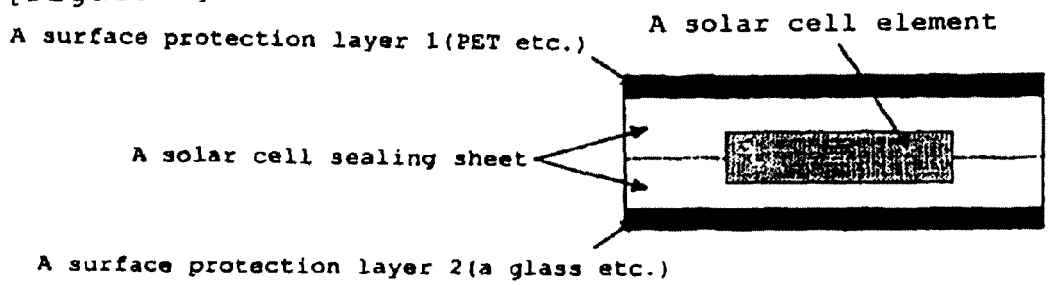
[Figure 6]
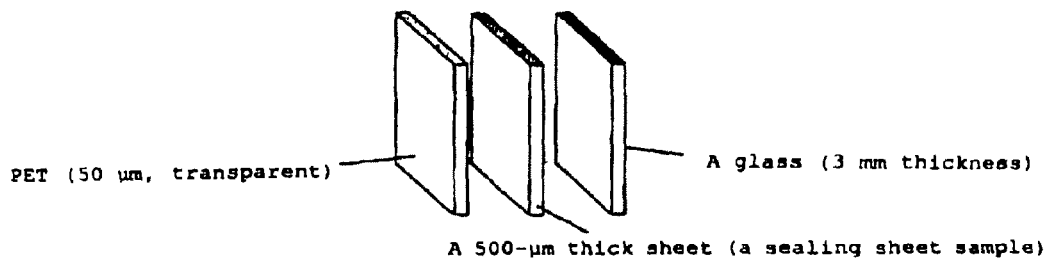
[Figure 7]
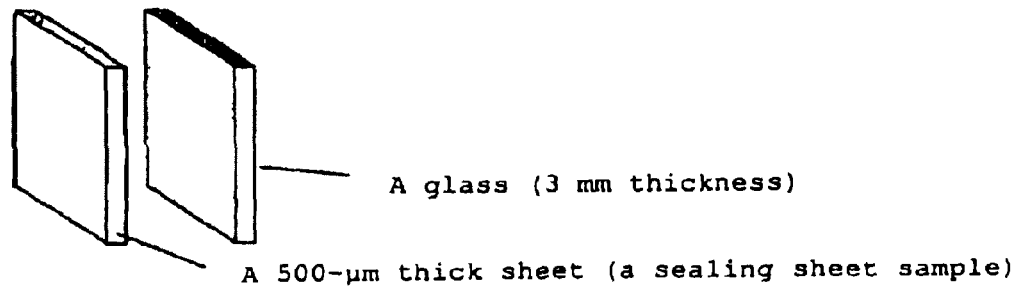

THERMOPLASTIC RESIN COMPOSITION, A SOLAR CELL SEALING SHEET, AND A SOLAR CELL

CROSS-REFERENCE TO RELATED APPLICATION(S)

This application is a Divisional of U.S. patent application Ser. No. 11/783,891, filed Apr. 12, 2007, which claims priority from Japanese Patent Application No. 2006-111069, filed Apr. 13, 2006. The contents of these applications are incorporated herein by reference in their entirety.

BACKGROUND OF THE INVENTION

1. Field of the Invention

The present invention relates to the sheet for sealing a solar cell between a front and a back material made of a sheet or a plate of a glass, a plastic and the like, particularly relates to a non-crosslinked solar cell sealing sheet capable of performing thermal lamination at low temperature.

2. Description of the Related Art

Conventionally, as a solar cell sealing sheet of this type, an organic peroxide-containing ethylene-vinyl acetate copolymer (abbreviated as EVA) has been generally used, since it has resin characteristics of good flexibility, high transparency, and excellent long-term durability by blending with an appropriate additive such as a weathering stabilizer, an adhesion promoter and the like.

However, because EVA has such drawbacks as lower melting point and poorer heat resistance that causes heat distortion at the temperature where a solar cell module is used, the hest-resistance has been effected by blending it with an organic peroxide in order to form a crosslinked structure.

A solar cell sealing sheet can be formed by a publicly-known sheet forming method capable of forming a polyolefin, but such a method as blending the organic peroxide has problems to cause deterioration of high speed productivity since the sheet formation is forced to be performed at low temperature in order to prevent decomposition of the organic peroxide.

In the process for producing a solar cell having the structure of (a surface protection layer=glass, plastics)/(a solar cell sealing sheet)/(a power module=a solar cell element)/(a solar cell sealing sheet)/(a surface protection layer=glass, plastics), generally employed are two processes composed of a tentative adhesion process by thermal lamination under vacuum and a crosslinking process in an oven at high temperature. This crosslinking process by organic peroxide requires several ten minutes, and therefore shortening of the crosslinking process time or elimination itself is strongly requested.

Further, there exists the concern that the power generation efficiency may be lowered by the adverse effect on a power module caused by a decomposition gas (acetic acid gas) from EVA or by the vinyl acetate group of EVA itself.

In order to avoid the above-mentioned problems associated with EVA, a solar cell sealing sheet employing an ethylene-•-olefin copolymer (Japanese Patent Laid-Open Publication No. 2000-91611) was proposed. It has been considered that these materials may reduce the adverse effects on a power module, but the balance between heat resistance and flexibility was not sufficiently good, and in addition, good heat resistance could not be realized without crosslinking, so that it has been difficult to eliminate the crosslinking process.

Inventors of the present invention have tackled the development of a solar cell sealing sheet usable even without being crosslinked, based on polypropylene or a copolymer mainly composed of propylene having excellent heat resistance. As a result of investigation by the present inventors, it has become clear that, although the solar cell sealing sheet based on such polypropylene or a copolymer mainly composed of propylene has good flexibility and heat resistance, there exist problems that the applicable temperature range for thermal lamination (process to adhere or fuse by heating a stack of a solar cell power module, a solar cell sealing sheet of the present invention, and further a glass or a back sheet) during solar cell manufacturing is very narrow.

During thermal lamination, low temperature as possible (specifically 160° C. or less, or more preferably below 160° C.) is preferred for thermal lamination, since a power module constituting the above-mentioned solar cell and a surface protection layer are damaged at high temperature.

In Japanese Patent Laid-Open Publication No. H11-163377, thermal lamination of a transparent resin between 120° C. and 160° C. is also described.

SUMMARY OF THE INVENTION

By investigation of the present inventors, it has become clear that, when a material based on polypropylene or a copolymer mainly composed of propylene is heated at the neighborhood temperature of the melting point, cloudiness is generated, and thus transparency of a solar cell sealing sheet using this material is seriously damaged. Therefore, the present inventors considered that to develop a non-crosslinked solar cell sealing sheet satisfying both heat resistance and thermal lamination properties at low temperature by solving these problems was the subject.

An object of the present invention is to provide a thermoplastic resin composition and a solar cell sealing sheet comprised thereof having sufficient heat resistance for practical use with a property that cloudiness is not generated by thermal lamination at low temperature, while retaining flowability in the extent of allowing for molding.

A first thermoplastic resin composition of the present invention comprises 1 to 95% by weight of a propylene-based polymer (A) and 5 to 99% by weight of a propylene-based copolymer (B) with at least one •-olefin having 2 to 20 carbon atoms other than propylene, wherein (A) has the following characteristics of (i) and (ii), and (B) has a melting point below 80° C. or does not show a melting point as measured by a differential scanning calorimeter (here, the sum of (A) and (B) is 100% by weight). Characteristics of a propylene-based polymer (A):

(i) Melting point measured by a differential scanning calorimeter (DSC) method is in the range of 80 to 135° C.
(ii) Endotherm attributable to crystal melting is not observed at 140° C. or more in the endothermic curve measured by a differential scanning calorimeter (DSC) method.

In the first thermoplastic resin composition of the present invention, it is preferable for a propylene-based polymer (A) to further satisfy the following (iii).

(ii) Melting point (Tm) measured by a differential scanning calorimeter (DSC) and Vicat softening temperature (Tv) measured in accordance with ASTM D1525 satisfy Equation (I):

$$0.234 \times (Tm)^{1.277} \leq Tv \leq Tm \qquad \text{Equation (I)}$$

(here, Tm is in the range of 80 to 135° C.).

The first thermoplastic resin composition of the present invention may contain 0.1 to 5 parts by weight of a coupling agent (Y) relative to total 100 parts by weight of the propylene-based polymer (A) and the propylene-based copolymer (B).

It is preferable that the first thermoplastic resin composition mentioned above has 0.05 g/10 min or more of MFR at 230° C.

A thermoplastic resin composition obtained by melt-kneading a mixture, comprising 1 to 95% by weight of the propylene-based polymer (A) and 99 to 5% by weight of the propylene-based copolymer (B) (the sum of (A) and (B) is 100% by weight), and 0.1 to 5 parts by weight of the coupling agent (Y) relative to 100 parts by weight of the sum of (A) and (B) in the presence of an organic peroxide is one preferred embodiment of the present invention (hereinafter it may be called as "the second thermoplastic resin composition"). It is preferable that the second thermoplastic resin composition has 0.05 g/10 min or more of MFR at 230° C.

Both of these first and second thermoplastic resin compositions are suitably used for solar cell sealing. A solar cell sealing sheet of the present invention comprises the first or the second thermoplastic resin composition.

A solar cell of the present invention comprises using the above-mentioned solar cell sealing sheet.

A third thermoplastic resin composition of the present invention comprises 1 to 95% by weight of a propylene-based polymer (AA) and 5 to 99% by weight of a propylene-based copolymer (BB) with at least one •-olefin having 2 to 20 carbon atoms other than propylene, wherein (AA) satisfies the following (ia) and (iia) and (BB) has a melting point below 80° C. or does not show a melting point as measured by a differential scanning calorimeter (DSC) method.

(ia) A melting point measured by a differential scanning calorimeter (DSC) method is 80° C. or more and 140° C. or less.
(iia) Molecular weight distribution obtained by a gel permeation chromatography (GPC) is 3 or less.

In the third thermoplastic resin composition of the present invention, the propylene-based copolymer (BB) is preferably a propylene-ethylene-•-olefin copolymer (BB-1);

A propylene-ethylene-•-olefin copolymer (BB-1) comprises 45 to 92 mol % of the constituent unit derived from propylene, 5 to 25 mol % of the constituent unit derived from ethylene, and 3 to 30 mol % of the constituent unit derived from an •-olefin having 4 to 20 carbon atoms, and has its melting point below 80° C. or does not show a melting point as measured by a differential scanning calorimeter.

In the third thermoplastic resin composition of the present invention, 0.1 to 5 parts by weight of a coupling agent (Y) may be blended relative to 100 parts of the sum of the propylene-based polymer (AA) and the propylene-based copolymer (BB).

It is preferable that the third thermoplastic resin composition of the present invention has 0.05 g/10 min or more of MFR at 230° C.

The third thermoplastic resin composition is suitably used for solar cell sealing.

Another solar cell sealing sheet of the present invention comprises the third thermoplastic resin composition.

Another solar cell of the present invention comprises using the above-mentioned solar cell sealing sheet formed from the third thermoplastic resin composition of the present invention.

By using the first or the second thermoplastic resin composition of the present invention, a solar cell sealing sheet having sufficiently good heat resistance for practical use with a property that cloudiness is not generated by thermal lamination at low temperature, while retaining flowability in the extent of allowing for molding, can be provided. By using this solar cell sealing sheet, the applicable temperature range for thermal lamination during the solar cell manufacturing is widened, and specifically, damage to other members (a power module or a surface protection layer) can be reduced since thermal lamination can be performed at lower temperature. Furthermore, since the crosslinking process causing deterioration of resin flowability is not necessary for effecting the heat resistance, the time for solar cell manufacturing process can be shortened significantly and also the recycling of the solar cell after use can be easier. In addition, the first thermoplastic resin composition blended with the coupling agent (Y) becomes a thermoplastic resin composition having excellent adhesive properties with an objective material as well. The second thermoplastic resin composition also becomes a thermoplastic resin composition having excellent adhesive properties with an objective material.

By using the third thermoplastic resin composition of the present invention, a solar cell sealing sheet having sufficiently good heat resistance for practical use with a property that cloudiness is not generated by thermal lamination at low temperature, while retaining flowability in the extent of allowing for molding, can be provided. By using this solar cell sealing sheet, the applicable temperature range for thermal lamination during the solar cell manufacturing is widened, and specifically, damages to other members (a power module or a surface protection layer) can be reduced since thermal lamination can be performed at lower temperature. Furthermore, since the crosslinking process causing deterioration of resin flowability is not necessary for effecting the heat resistance, the time for solar cell manufacturing process can be shortened significantly and also the recycling of the solar cell after use can be easier.

BRIEF DESCRIPTION OF THE DRAWINGS

FIG. 1 shows the DSC curve when the temperature is raised from −150° C. to 200° C. for the propylene-based polymer (A-1) used in Example at the heating rate of 20° C./min.

FIG. 2 shows the DSC curve for the propylene-based polymer (A-2) used in Example.

FIG. 3 shows the DSC curve for the propylene-based polymer (A-3) used in Example.

FIG. 4 shows the DSC curve for the propylene-based polymer (A-4) used in Example.

FIG. 5 shows one embodiment in which the solar cell sealing sheet of the present invention is applied.

FIG. 6 shows the samples used for heat resistance test in Example 11 and Comparative Example 11.

FIG. 7 shows the samples used for the glass-adhesion test in Example 11 and Comparative Example 11.

DESCRIPTION OF THE PREFERRED EMBODIMENTS

The First and Second Thermoplastic Resin Compositions, a Solar Cell Sealing Sheet Using the Compositions Thereof, and a Solar Cell Using the Solar Cell Sealing Sheet Thereof
(A) A Propylene-Based Polymer As a propylene-based polymer used in the present invention, there may be mentioned a propylene homopolymer or a copolymer of propylene with at least one •-olefin having 2 to 20 carbon atoms other than propylene. Here, examples of the •-olefin having 2 to 20 carbon atoms other than propylene include ethylene, 1-butene, 1-pentene, 1-hexene, 4-methyl-1-pentene, 1-octene, 1-decene, 1-dodecene, 1-tetradecene, 1-hexadecene, 1-octadecene, 1-eicosene and the like, though a copolymer with ethylene and/or an •-olefin having 4 to 10 carbon atoms may be preferably used.

The constituent unit derived from •-olefins in the polypropylene may be 35 mol % or less, preferably 20 mol % or less (here, the sum of the constituent unit derived from propylene and the constituent unit derived from •-olefin (other than propylene) is 100 mol %). Further two or more kinds of the constituent units derived from the •-olefins other than propylene may be contained.

These •-olefins may form a random or a block copolymer with propylene, though a random copolymer may be preferably used in the present invention.

As mentioned above, in the present invention a random copolymer of propylene with an •-olefin having 2 to 20 carbon atoms (other than propylene) is preferred, wherein the amount of the constituent unit derived from •-olefin having 2 to 20 carbon atoms is preferably 1 to 7.5 mol %, more preferably 2 to 7 mol %, and further preferably 2.5 to 6.5 mol %.

Further, a propylene-based polymer (A) has desirably the melt flow rate (MFR) of 0.01 to 1000 g/10 min, and preferably 0.05 to 100 g/10 min as measured at 230° C. under a load of 2.16 kg in accordance with ASTM D1238.

The melting point (the peak of the endothermic curve showing melting of propylene-based polymer crystals) of the propylene-based polymer (A) of the present invention as measured by a differential scanning calorimeter (DSC) is in the range of 80 to 135° C., preferably 100 to 135° C., more preferably 110 to 130° C., and particularly preferably 115° C. to 130° C.

In the propylene-based polymer (A) of the present invention, the endotherm due to crystal melting is not observed at 140° C. or more in the endothermic curve as measured by a differential scanning calorimeter (DSC) method. Here, the methods for measuring melting point and for confirmation of whether or not the endotherm at 140° C. or more exists are as those described in "(1) Melting point and confirmation of presence or absence of the endotherm at 140° C. or more" in Examples.

Here, the phrase "the endotherm due to crystal melting is not observed" is defined as follows.

Namely, dried alumina packed in the same aluminum pan as the one described in 1-1) of the above-mentioned "(1) Melting point and confirmation of presence or absence of the endotherm at 140° C. or more" is prepared as the reference, and then the vertical axis value (heat quantity) of the endothermic curve obtained according to the conditions of (i) to (iii) in the above-mentioned 1-1) is taken as follows.

$D_{top}$=the vertical axis value at the peak point of melting point (maximum melting point)

$D_{140° C.}$=the vertical axis value at 140° C.

$D_{105° C.}$=the vertical axis value at 150° C.

Further, D1 and D2 are defined as below, and when they satisfy Equation (1) or preferably Equation (1'), it means that the endotherm due to crystal melting is not observed at 140° C. or more.

$D1=D_{top}-D_{150° C.}$ $D2=D_{140° C.}-D_{150° C.}$ $$D2/D1 \leq 0.05 \qquad \text{Equation (1)}$$

$$D2/D1 \leq 0.03 \qquad \text{Equation (1')}$$

Here, D2 may take a negative value.

Here, the DSC measurement conditions to confirm melting point and the quantity of heat of fusion are those described in Examples.

A propylene-based polymer (A) has the tensile modulus of usually 600 MPa or more, preferably 700 MPa or more, and more preferably 750 MPa or more as measured at 23° C. by using a dumbbell in accordance with JIS K7113-2, the chuck distance of 80 mm, and the tensile rate of 200 mm/min, though the modulus is not particularly restricted to these values.

The sample for the measurement is the press sheet obtained by hot-pressing a sample at 190° C. between the upper and the lower SUS molds with 4-mm thickness, followed by rapid cooling with a cooling chiller of 20° C. for molding, then kept for 72 hours or longer.

The propylene-based polymers (A) of the present invention are suitably those whose melting point (Tm) measured by a differential scanning calorimeter (DSC) and Vicat softening temperature (Tv) measured in accordance with ASTM D1525 satisfy the following Equation (2) or preferably Equation (2)'.

$$0.234 \times (T)^{1.277} \leq Tv \leq Tm \qquad \text{Equation (2)}$$

$$0.234 \times (T)^{1.277} \leq Tv \leq 0.902 \times (Tm)^{1.011} \qquad \text{Equation (2)':}$$

(here, Tm is between 80° C. and 135° C.).

The propylene-based polymer (A) having (i) melting point of 135° C. or less and satisfying the above-mentioned (ii) indicates that it has a narrow composition distribution, namely a narrow melting point distribution.

The thermoplastic resin composition of the present invention using such propylene-based polymer (A) can maintain good transparency because less cloudiness takes place even though the temperature of the thermal lamination is further lowered.

The propylene-based polymer (A) having (i) melting point of 135° C. or less and satisfying the (ii), and further the above-mentioned relationships between melting point Tm and Vicat softening temperature Tv, means that it is composed of molecules having homogeneous composition distribution.

Generally, polypropylene has lower Vicat softening temperature (Tv) than melting point (Tm), and especially polypropylene with wider composition distribution tends to have larger difference between melting point Tm and Vicat softening temperature Tv. On the contrary, Tm and Tv satisfying the above equations (the difference between melting point Tm and Vicat softening temperature Tv is small) means that the propylene-based polymer (A) has a very narrow composition distribution.

The sample for the measurement of the Vicat softening point is the press sheet that is obtained by hot-pressing a sample at 190° C. between the upper and the lower SUS molds with 4-mm thickness, followed by rapid cooling with a cooling chiller of 20° C. for molding, then kept for 72 hours or longer.

The thermoplastic resin composition of the present invention using such propylene-based polymers (A) can maintain good transparency because cloudiness does not take place even though the thermal lamination is performed at the neighborhood temperature of the melting point (namely around at 150° C.).

As a reason for this, it is speculated that such propylene-based polymer (A) does not contain a component with high-melting point (namely a component showing the endotherm at 135° C. or more) because of a homogeneous composition distribution, and thus its crystalline lamella and crystalline domain size formed by crystallization become homogeneous.

The propylene-based polymer (A) of the present invention may be used either in isotactic or syndiotactic structures. In addition, plural propylene-based polymers (A) may be used in combination as appropriate, and for instance, two or more kinds of components having different melting point, rigidity, or molecular weight may be also used.

The above-mentioned propylene-based polymer (A) is obtained by polymerizing propylene or copolymerizing propylene with other •-olefin by using a Ziegler catalyst composed of solid catalyst component containing, for example, magnesium, titanium, halogen and an electron-donor as essential components, an organoaluminum compound, and an electron-donors, or by using a metallocene catalyst composed of a metallocene compound as one component, though the polymer obtained by using a metallocene catalyst system composed of a metallocene compound as one component can be preferably used as the propylene-based polymer (A) having the above-mentioned characteristics.

As the metallocene catalyst to be used, a metallocene catalyst composed of a publicly-known metallocene compound capable of polymerizing an •-olefin, an organoaluminum oxy-compound and/or a compound capable of forming an ion pair by reacting with a metallocene compound may be mentioned, but a metallocene catalyst capable of performing a stereoregular polymerization affordable such structures as isotactic or syndiotactic structure and the like may be preferably mentioned. For instance, they can be produced by using the catalysts described in the pamphlet of International Publication WO 2001-27124 and in Japanese Patent Laid-Open Publication No. 2006-52313. Preferred specific examples of the •-olefin used for copolymerization with propylene include ethylene, 1-butene, 1-pentene, 1-hexene, 4-methyl-1-pentene, 1-octene and the like.

A commercially available polymer may be also used as (A). For example, a propylene-based polymer (A) that satisfies Equation (2), preferably Equation (2)', may be produced by fractionally removing a component with low melting point from a propylene-based polymer that does not satisfy Equation (2).

(B) A Propylene-Based Copolymer

The propylene-based copolymers (B) of the present invention is a copolymer of propylene with at least one •-olefin having 2 to 20 carbon atoms other than propylene and have melting point below 80° C. or do not show melting point as measured by a differential scanning calorimeter DSC. Here, the phrase "do not show melting point" means that the crystal melting peak with the heat of crystal melting of 1 J/g or more is not observed between −150 to 200° C. The measurement conditions are as those described in Examples.

It is preferred that the propylene-based copolymer (B) used in the present invention has melting point of 60° C. or less or does not show a melting point as measured by DSC, and more preferably does not show a melting point.

In the propylene-based copolymer (B) of the present invention, an •-olefin used as a comonomer is preferably ethylene and/or an •-olefin having 4 to 20 carbon atoms.

The propylene-based copolymer (B) of the present invention contains 45 to 92 mol % and preferably 56 to 90 mol % of a propylene unit, and 8 to 55 mol % and preferably 10 to 44 mol % of an •-olefin as a comonomer.

The propylene-based copolymer (B) of the present invention desirably has the melt flow rate (MFR) of 0.01 to 1000 g/10 min, and preferably 0.05 to 50 g/10 min as measured at 230° C. and under a load of 2.16 kg in accordance with ASTM D1238.

As the method for producing the propylene-based copolymer (B) of the present invention, there is no particular restriction, but a publicly-known catalyst capable of performing stereoregular polymerization of olefins to afford isotactic or syndiotactic structures may be mentioned. For example it can be produced by copolymerizing propylene with other •-olefins in the presence of a catalyst composed of a solid titanium component and an organometallic compound as a main component, or a metallocene catalyst composed of a metallocene compound as one catalyst component. Preferably, as described later, it is produced by copolymerizing propylene, ethylene, and an •-olefin having 4 to 20 carbon atoms in the presence of a metallocene catalyst. For example, a catalyst described in International Publication WO 2004-087775, for example, such a catalyst described in Examples 1e to 5e in the pamphlet of said document and the like may be used.

The propylene-based copolymer (B) of the present invention is preferred to have the following properties additionally and independently.

Triad tacticity (mm fraction) as measured by $^{13}$C-NMR is preferably 85% or more, more preferably 85 to 97.5%, further preferably 87 to 97%, particularly preferably 90 to 97%. When the triad tacticity (mm fraction) is within this range, the polymer has particularly excellent balance between flexibility and mechanical strength, so that it is suitable for the present invention. The mm fraction can be measured by the method described from the line 7 of page 21 to the line 6 of page 26 in the pamphlet of International Publication WO 2004-087775.

Shore A hardness of the propylene-based copolymer (B) of the present invention is not particularly restricted, but usually in the range of 30 to 80, preferably 35 to 75.

Further, the propylene-based copolymer (B) in the present invention has the stress (M100) at 100%-strain of usually 4 MPa or less, preferably 3 MPa or less, and more preferably 2 MPa or less as measured at 23° C. in accordance with JIS K6301 by using JIS3 dumbbell, the span distance of 30 mm and the tensile rate of 30 mm/min. When the M100 of a propylene-based copolymer (B) is in this range, it is excellent in flexibility, transparency, and rubber elasticity.

The propylene-based copolymer (B) of the present invention has crystallinity of usually 20% or less, and preferably 0 to 15% as measured by X-ray diffraction. The propylene-based copolymer (B) of the present invention has a single glass transition temperature, and its glass transition temperature Tg as measured by a differential scanning calorimeter (DSC) is usually −10° C. or less, and preferably in the range of −15° C. or less.

When the glass transition temperature Tg of the propylene-based copolymer (B) of the present invention is in the above-mentioned range, it is excellent in cold resistance and low-temperature properties.

The propylene-based copolymer (B) of the present invention, when there exists melting point (Tm, ° C.) in the endothermic curve of a differential scanning calorimeter (DSC) method, has the quantity of heat of fusion •H of usually 30 J/g or less and is also subject to the following equation between C3 content (mol %) and the quantity of heat of fusion •H (J/g).

•H<345 Ln(C3 content mol %)−1492, here, when there is a melting point, 70≦C3 content (mol %)≦90 is usual.

The molecular weight distribution (Mw/Mn, relative to polystyrene standards, Mw: weight-average molecular weight, Mn: number-average molecular weight) of the propylene-based copolymer (B) of the present invention as measured by GPC is preferably 4.0 or less, more preferably 3.0 or less, and further preferably 2.5 or less.

Preferred specific examples for the propylene-based copolymers (B) of the present invention include the following propylene-ethylene-•-olefin copolymers (B-1). By using such propylene-ethylene-•-olefin copolymers (B-1), a solar cell sealing sheet having excellent flexibility and heat resistance, mechanical strength, solar cell sealability, and transparency is obtained. Here, the term "solar cell sealability" means that the cracking rate of a solar cell element (silicon cell) during power module setting is lowered due to excellent flexibility.

The propylene-ethylene-•-olefin copolymer (B-1) contains the constituent unit derived from propylene of 45 to 92 mol %, preferably 56 to 90 mol %, and more preferably 61 to 86 mol %, the constituent unit derived from ethylene of 5 to 25 mol %, preferably 5 to 14 mol %, and more preferably 8 to 14 mol %, and the constituent unit derived from an •-olefin having 4 to 20 carbon atoms of 3 to 30 mol %, preferably 5 to 30 mol %, and more preferably 6 to 25 mol %. As an •-olefin, 1-butene is particularly preferred.

A propylene-ethylene-•-olefin copolymer (B-1) containing the constituent units derived from propylene, ethylene, and •-olefins having 4 to 20 carbon atoms in such amounts has good compatibility with the propylene-based polymer (A), and thus the obtained solar cell sealing sheet exerts sufficient transparency, flexibility, heat resistance, and scratch resistance.

A Thermoplastic Resin Composition, and a Solar Cell Sealing Sheet

The first thermoplastic resin composition of the present invention comprises the following composition of (A) and (B) in the following blending amount.
(A) A propylene-based polymer of 1 to 95 parts by weight, preferably 5 to 80 parts by weight, and more preferably 10 to 50 parts by weight
(B) A propylene-based copolymer of 5 to 99 parts by weight, preferably 20 to 95 parts by weight, and more preferably 50 to 90 parts by weight
Here, the sum of (A) and (B) is 100 parts by weight.

When (A) and (B) are within the above-mentioned ranges, the sheet formability is excellent, and the obtained solar cell sealing sheet is excellent in heat resistance, transparency, and flexibility, and thus is suitable for the present invention.

Further, the thermoplastic resin composition of the present invention composed of the above-mentioned (A) and (B) is preferably blended with a coupling agent as an adhesion promoter to a glass, a plastic material, and the like, and thus can be suitably used to obtain a solar cell sealing sheet for adhesion with a glass or a plastic material.

A coupling agent (Y) used in the present invention is not particularly restricted so far as it can improve the adhesion of the layer containing thermoplastic resin composition of the present invention with another layer containing a resin having a polar group, or with another layer containing inorganic compounds such as a metal or a glass in an amount of 50% by weight or more, but a coupling agent of a silane-type, titanium-type, and chrome-type is preferably used, and a silane-type coupling agent (a silane coupling agent) is particularly preferred. A publicly-known silane coupling agent can be used without particular restriction, and specific examples include vinyl triethoxysilane, vinyl trimethoxysilane, vinyl tris(•-methoxyethoxysilane), •-glycidoxypropyl trimethoxysilane, •-aminopropyl triethoxysilane and the like. The blending amount of a silane coupling agent is 0.1 to 5 parts by weight or preferably 0.1 to 3 parts by weight relative to 100 parts by weight of the sum of the above-mentioned (A) propylene-based polymer and (B) propylene-based copolymer.

The coupling agent (Y) may be present in the state of being grafted with at least one of (A) and (B) that constitute the thermoplastic resin composition by using an organic peroxide. In this case, the amount of the coupling agent to be used is preferably about 0.1 to 5 parts by weight relative to 100 parts of the sum of the above-mentioned (A) propylene-based polymer and (B) propylene-based copolymer. The use of the silane-grafted thermoplastic resin composition also affords adhesion properties to a glass or a plastic material equal to or greater than those of a blend containing a silane coupling agent.

When an organic peroxide is used, its amount is, for example, 0.001 to 5 parts by weight, and preferably 0.01 to 3 parts by weight relative to total 100 parts by weight of the above-mentioned (A) and (B).

A publicly-known organic peroxides can be used with no particular restriction, and specific examples include dilauroylperoxide, 1,1,3,3-tetramethylbutylperoxy-2-ethylhexanoate, dibenzoylperoxide, t-amylperoxy-2-ethylhexanoate, t-butylperoxy-2-ethylhexanoate, t-butylperoxyisobutyrate, t-butylperoxymaleic acid, 1,1-di(t-amylperoxy)-3,3,5-trimethylcyclohexane, 1,1-di(t-amylperoxy)cyclohexane, t-amylperoxyisononanoate, t-amylperoxy-n-octoate, 1,1-di(t-butylperoxy)-3,3,5-trimethylcyclohexane, 1,1-di(t-butylperoxy)cyclohexane, t-butylperoxyisopropylcarbonate, t-butylperoxy-2-ethylhexylcarbonate, 2,5-dimethyl-2,5-di(benzoylperoxy)hexane, t-amyl-peroxybenzoate, t-butylperoxyacetate, t-butylperoxyisononanoate, t-butylperoxybenzoate, 2,2-di(butylperoxy)butane, n-butyl-4,4-di(t-butylperoxy)butyrate, methylethylketone peroxide, ethyl-3, 3-di(t-butylperoxy)butyrate, dicumylperoxide, t-butylcumylperoxide, di-t-butylperoxide, 1,1,3,3-tetramethylbutylhydroperoxide, acetylacetoneperoxide, and the like.

Further, in the present invention, the following auxiliary agents can be used as necessary. Specific examples of auxiliary agents include peroxy auxiliary agents such as sulfur, p-quinonedioxime, p,p'-dibenzoylquinonedioxime, N-methyl-N-4-dinitrosoaniline, nitrosobenzene, diphenylguanizine trimethylolpropane-N,N'-m-phenylenedimaleimide and the like; or divinylbenzene, triallyl cyanurate (TAC), and triallyl isocyanurate (TAIC). In addition, the examples include polyfunctional methacrylate monomers such as ethyleneglycol dimethacrylate, diethyleneglycol dimethacrylate, polyethyleneglycol dimethacrylate, trimethylolpropane trimethacrylate, allyl methacryate and the like, and polyfunctional vinyl monomers such as vinyl butyrate and vinyl stearate, and the others. Among them, triallyl cyanurate (TAC) and triallyl isocyanurate (TAIC) are preferred.

In the present invention, the above-mentioned auxiliary agent is used with an organic peroxide in the weight ratio (auxiliary agent/organic peroxide) of 1/30 to 20/1, and preferably 1/20 to 10/1.

The first thermoplastic resin composition of the present invention may be crosslinked but preferably non-crosslinked. Here, the term "crosslinked" means that MFR of the thermoplastic resin composition at 230° C. is 0.04 g/10 min or less.

It is preferred that the first thermoplastic resin composition of the present invention has MFR of 0.05 g/10 min or more at 230° C.

The Second Thermoplastic Resin Composition

The second thermoplastic resin composition of the present invention is prepared by melt kneading, in the presence of the above-mentioned organic peroxide, a mixture comprising 1 to 95% by weight of the propylene-based polymer (A) and 5 to 99% by weight of the propylene-based copolymer (B) (the sum of (A) and (B) is 100% by weight) with the coupling agent (Y), wherein the amount of Y is 0.1 to 5 parts by weight relative to total 100 parts by weight of (A) and (B). For example, two or more kinds selected from (A), (B), and (Y) are pre-blended to obtain a composition, which then may be used for melt kneading with the organic peroxide. The temperature of melt kneading with the organic peroxide is not particularly restricted, but it should be above the temperature to initiate decomposition of the organic peroxide, and should be in such level as not to cause significant thermal deterioration of the thermoplastic resin composition, for example, 140° C. to 300° C.

In addition, a component other than the above-mentioned (A), (B), and (Y) may be further contained in a range of amount that does not impair the objects of the present invention. For instance, additives to be described later may be included.

The second thermoplastic resin composition of the present invention may be crosslinked, but preferably non-crosslinked. Here, the term "crosslinked" means that MFR of a thermoplastic resin composition at 230° C. is 0.04 g/10 min or less.

It is preferred that the second thermoplastic resin composition of the present invention has MFR of 0.05 g/10 min or more at 230° C.

Various Additives

The first or the second thermoplastic resin composition of the present invention may be blended with various kinds of other additives. Examples for such additives include an UV absorber that can prevent the deterioration due to UV rays in the sun light, a light stabilizer, an antioxidant and the like.

Specific examples of the UV absorbers include a benzophenone-type such as 2-hydroxy-4-methoxybenzophenone, 2-2-dihydroxy-4-methoxybenzophenone, 2-hydroxy-4-methoxy-4-carboxybenzophenone, 2-hydroxy-4-N-octoxybenzophenone and the like, a benzotriazole-type such as 2-(2-hydroxy-3,5-di-t-butylphenyl)benzotriazole, 2-(2-hydroxy-5-methylphenyl)benzotriazole and the like, and a salicylate-type such as phenyl salicylate, p-octylphenyl salicylate, and the like.

As the light stabilizer, a hindered amine-type is used. As the antioxidant, a hindered phenol-type and a phosphite-type are used.

As the first or second thermoplastic resin composition, the composition having light transmittance (trans) of 86% or more, and preferably of 88% or more are preferably used, wherein the light transmittance is measured by using a press sheet with 0.5-mm thickness (the both surfaces of which are smooth by using a PET film for example (trade name "Lumiror", manufactured by Toray Industries, Inc.) and the like as a mold releasing film).

The first or the second thermoplastic resin composition of the present invention has the melt flow rate (ASTM D1238, 230° C., 2.16 kg load) of usually 0.05 to 1000 g/10 min, preferably 0.1 to 900 g/10 min, and more preferably 0.5 to 800 g/10 min.

Further, in the first or the second thermoplastic resin composition of the present invention, the melt tension (MT) is usually 0.5 to 10 g, and preferably 1 to 10 g. Within these ranges, moldability to form the solar cell sealing sheet of the present invention is excellent. Here, the melt tension (MT) is measured at 200° C. as a tensile force applied to a filament when a strand is pulled at a constant speed (10 m/min) by using a melt tension tester (manufactured by Toyo Seiki Seisaku-sho, Ltd.), wherein the strand is extruded at the extrusion speed of 15 mm/min.

Into the first or second thermoplastic resin composition of the present invention, other additives can be added within the range that does not impair the objects of the present invention. Examples of such additives include an UV absorber for preventing deterioration due to UV rays in the sun light, a light stabilizer, an antioxidant, a heat stabilizer, an antistatic agent, an anti-slipping agent, an anti-blocking agent, an anti-clouding agent, a transparent nucleating agent, a lubricant (silicon oil and the like), pigments, a dye, a plasticizer, an antiaging agent, a hydrochloric acid absorber, and the like.

A Solar Cell Sealing Sheet, and a Solar Cell

The solar cell sealing sheet of the present invention is, for example, the one that is comprised of the above-mentioned first or second thermoplastic resin composition, and its thickness is, for example, preferably 0.1 mm to 3 mm, though not particularly restricted. This range is preferred because a damage to a glass or a solar cell module during lamination process can be reduced, and is also preferred from the viewpoint of the light transmittance and photovoltaic power generation.

A molding method to produce the solar cell sealing sheet of the present invention is not particularly restricted, and it can be molded by a publicly-known extrusion molding (such as cast molding, extrusion sheet molding, inflation molding and injection molding), a press molding, a calendar molding, and the like. Further, the sheet can be embossed, by which its surface is decorated so that blocking of the sheets with each other may be prevented. In addition, a damage to a glass or a solar cell module during lamination can be prevented, since the embossing can work as a cushion to these materials.

A power module laminated with the solar cell sealing sheet of the present invention on one and/or both side(s), in which a surface protection layer is laminated on the outer surface of the solar cell sealing sheet as necessary, can be used as a solar cell. One exemplary embodiment for the application of the solar cell sealing sheet is shown in FIG. 5.

The forming methods for a solar cell are not particularly restricted, and for example, it can be obtained by laminating a surface protection layer, a solar cell element, and a solar cell sealing sheet of the present invention in turn, and then hot-pressing them, for example, by aspiration under vacuum and the like.

The surface protection layer used for the front and back surfaces of the solar cell sealing sheet of the present invention is not particularly restricted, and a publicly-known material can be used so long as it can protect the layer composed of a solar cell and a solar cell sealing sheet, and does not impair the objects as a solar cell. Specific examples of materials for the surface protection layer include not only a glass but also such materials as a polyethylene resin, a polypropylene resin, a cyclic polyolefin resin, an AS (acrylonitrile-styrene) resin, an ABS (acrylonitrile-butadiene-styrene) resin, an polyvinyl chloride resin, a fluorinated resin, polyester resins such as polyethylene terephthalate, polyethylene naphthalate, and the like, a phenolic resin, a polyacryl-type resin, polyamide resins such as various kinds of nylons, a polyimide resin, a polyamide-imide resin, a polyurethane resin, a cellulosic resin, a silicone-type resin, a polycarbonate resin and the like. They can be also used in a combination of plural kinds. In addition, with the aim to improve permeation barrier of gases and water, an inorganic/organic composite film that is vapor-deposited with an inorganic oxide etc. can be also preferably used.

In order to improve the adhesion strength between a surface protection layer and a solar cell sealing sheet of the present invention, and between plural surface protection layers themselves, a publicly-known adhesive and an adhesive resin layers can be provided. In addition, depending on the embodiment of the solar cell of the present invention, one side of the surface protection layer may have light shielding/light reflecting properties.

The Third Thermoplastic Resin Composition (AA) A Propylene-Based Polymer

Examples of the propylene-based polymers (AA) used in the present invention include a propylene homopolymer or a copolymer of propylene with at least one •-olefin having 2 to 20 carbon atoms other than propylene. Here, examples of the •-olefins having 2 to 20 carbon atoms other than propylene include ethylene, 1-butene, 1-pentene, 1-hexene, 4-methyl-1-pentene, 1-octene, 1-decene, 1-dodecene, 1-tetradecene, 1-hexadecene, 1-octadecene, 1-eicosene and the like, though a copolymer with ethylene and/or an •-olefin having 4 to 10 carbon atoms may be preferably used in the present invention.

The constituent units derived from these •-olefins in the polypropylene may be contained in the amount of 35 mol % or less, and preferably 20 mol % or less. Further, the constituent unit derived from an •-olefin other than propylene may contain two or more kinds.

These •-olefins may form a random or a block copolymer with propylene, though a random copolymer may be preferably used in the present invention.

As mentioned above, in the present invention a random copolymer of propylene with an •-olefin having 2 to 20 carbon atoms (other than propylene) is preferred, wherein the content of the constituent unit derived from an •-olefin is preferably 1 to 7.5 mol %, more preferably 2 to 7 mol %, and further preferably 2.5 to 6.5 mol %.

Further, the melt flow rate (MFR) of the propylene-based polymer (AA) as measured at 230° C. under a load of 2.16 kg in accordance with ASTM D1238 is desirably in the range of 0.01 to 1000 g/10 min, and more preferably 0.05 to 100 g/10 min.

The melting point (the peak of endothermic curve that shows melting of crystals of a propylene-based polymer) of the propylene-based polymer (AA) of the present invention as measured by a differential scanning calorimeter (DSC) method is 80° C. or more to 140° C. or less, more preferably 110 to 140° C., and further preferably 110 to 135° C. DSC measurement conditions for confirming melting point and the quantity of heat of fusion are those described in Examples.

Further, the propylene-based polymer (AA) of the present invention has the molecular weight distribution, as measured by a gel permeation chromatography (GPC), of 3 or less, preferably 1 to 2.7, and more preferably 1.8 to 2.5.

By using the propylene-based polymer (AA) of the present invention having melting point and molecular weight distribution in the above range, a thermoplastic resin composition that is not cloudy even when heated at the neighborhood temperature of the melting point of (AA) (namely around 150° C.) can be obtained. Although the reasons for this are unclear, as one of the reasons, it is inferred that the propylene-based polymer (AA) is comprised of molecules having a homogeneous composition distribution and the like so that crystallization speeds of the molecules are homogeneous, and thus it is expected to give homogeneous crystalline lamella and crystalline domain size when the molecules in the molten state at the neighborhood temperature of the melting points (namely around 150° C.) are crystallized.

The propylene-based polymer (AA) of the present invention may be used both in isotactic and syndiotactic structures so long as they are well compatible with the propylene-based copolymer (BB) described below. In addition, plural propylene-based polymers (AA) can be used simultaneously as necessary. For example, two or more kinds of components having different melting points or rigidities may be also used.

These propylene-based polymers (AA) are obtained by polymerizing propylene or copolymerizing propylene with other •-olefins in the presence of a metallocene catalyst containing a metallocene compound as one catalyst component.

As the metallocene catalyst to be used, a metallocene catalyst comprising a publicly-known metallocene compound capable of polymerizing •-olefins and an organoaluminum oxy-compound and/or a compound capable of forming an ion pair by reacting with a metallocene compound, preferably a metallocene catalyst capable of performing a stereoregular polymerization that can afford such structures as isotactic or syndiotactic may be mentioned. For instance, they can be produced by using the catalysts described in the pamphlet of International Publication WO 2001-27124 and Japanese Patent Laid-Open Publication No. 2006-52313. Preferred specific examples of •-olefins used for the copolymerization with propylene include ethylene, 1-butene, 1-pentene, 1-hexene, 4-methyl-1-pentene, 1-octene and the like.

(BB) A Propylene-Based Copolymer

The propylene-based copolymer (BB) of the present invention is a copolymer of propylene with at least one •-olefin having 2 to 20 carbon atoms other than propylene, having Shore A harness of 30 to 80, preferably 35 to 70, and having the melting point below 80° C. or showing no melting point as measured by a differential scanning calorimeter DSC. Here, the term "no melting point" means that the crystal melting peak with the heat of crystal melting of 1 J/g or more is not observed in the temperature range of −150 to 200° C. The measurement conditions are as those described in Examples.

In the propylene-based copolymer (BB) of the present invention, an •-olefin used as a comonomer is preferably ethylene and/or an •-olefin having 4 to 20 carbon atoms.

The propylene-based copolymer (BB) of the present invention contains 45 to 92 mol %, preferably 56 to 90 mol % of a propylene unit, and 8 to 55 mol %, preferably 10 to 44 mol % of an •-olefin as a comonomer to be used.

Melt flow rate (MFR) of the propylene-based copolymer (BB) of the present invention as measured at 230° C. under a load of 2.16 kg in accordance with ASTM D1238 is desirably in the range of 0.01 to 1000 g/10 min, preferably 0.05 to 50 g/10 min.

As the method for producing the propylene-based copolymer (BB) of the present invention, there is no particular restriction, but it can be produced by copolymerizing propylene with other •-olefins in the presence of a publicly-known catalyst capable of performing stereoregular polymerization of olefins to afford isotactic or syndiotactic structures, for example a catalyst containing a solid titanium component and an organometallic compound as main components, or a metallocene catalyst containing a metallocene compound as one catalyst component. Preferably, as described below, it is obtained by copolymerization of propylene, ethylene, and an •-olefin having 4 to 20 carbon atoms in the presence of a metallocene catalyst, and for example, a catalyst described in International Publication WO 2004-087775, for example, a catalyst described in Examples 1e to 5e in the pamphlet of the said document may be used.

The propylene-based copolymer (BB) of the present invention is preferred to have the following properties additionally and independently.

Triad tacticity (mm fraction) as measured by $^{13}$C-NMR is preferably 85% or more, more preferably 85 to 97.5%, further preferably 87 to 97%, and particularly preferably 90 to 97%. When the triad tacticity (mm fraction) is in this range, the balance between flexibility and mechanical strength is excellent in particular, so that it is suitable for the present invention. The mm fraction can be measured by the method described from the line 7 of page 21 to the line 6 of page 26 in the pamphlet of International Publication WO 2004-087775.

Shore A hardness of the propylene-based copolymer (BB) of the present invention is not particularly restricted, but is usually in the range of 30 to 80, and preferably of 35 to 75.

Further, the propylene-based copolymer (BB) of the present invention has the stress (M100) at 100%-strain of usually 4 MPa or less, preferably 3 MPa or less, and more preferably 2 MPa or less as measured at 23° C. in accordance with JIS K6301 by using the JIS3 dumbbell, wherein the span distance of 30 mm and the tensile rate of 30 mm/min are employed. When M100 of the propylene-based copolymer (BB) is in this range, it is excellent in flexibility, transparency and rubber elasticity.

The propylene-based copolymer (BB) of the present invention has crystallinity of usually 20% or less, and preferably 0 to 15% as measured by X-ray diffraction. The propylene-based copolymer (BB) of the present invention has a single glass transition temperature, and its glass transition temperature Tg as measured by a differential scanning calorimeter (DSC) is usually −10° C. or less, and preferably in the range of −15° C. or less.

When the glass transition temperature Tg of the propylene-based copolymer (BB) of the present invention is in the above-mentioned range, it is excellent in cold resistance and low temperature properties.

If the propylene-based copolymer (BB) of the present invention has a melting point (Tm, ° C.) in the endothermic curve of a differential scanning calorimeter (DSC), it usually has the quantity of heat of fusion •H of 30 J/g or less and the following equation can be applied to the relation between C3 content (mol %) and the quantity of heat of fusion •H (J/g).
•H<345 Ln(C3 content, mol %)−1492,
here, it is usually 76≦C3 content (mol %)≦90.

The molecular weight distribution (Mw/Mn, in terms of polystyrene, Mw: the weight-average molecular weight, Mn: the number-average molecular weight) of the propylene-based copolymer (BB) of the present invention as measured by GPC is preferably 4.0 or less, more preferably 3.0 or less, and further preferably 2.5 or less.

Preferred specific examples of the propylene-based copolymers (BB) of the present invention include the following propylene-ethylene-•-olefin copolymers (BB-1). By using such a propylene-ethylene-•-olefin copolymer (BB-1), a solar cell sealing sheet having excellent flexibility and heat resistance, mechanical strength, solar cell sealability, and transparency is obtained. Here, the term "solar cell sealability" means that cracking rate of a solar cell element (silicon cell) during power module setting is lowered due to excellent flexibility.

The propylene-ethylene-•-olefin copolymer (BB-1) contains the constituent unit derived from propylene of 45 to 92 mol %, preferably 56 to 90 mol %, and more preferably 61 to 86 mol %, the constituent unit derived from ethylene of 5 to 25 mol %, preferably 5 to 14 mol %, and more preferably 8 to 14 mol %, and the constituent unit derived from an •-olefin having 4 to 20 carbon atoms of 3 to 30 mol %, preferably 5 to 30 mol %, and more preferably 6 to 25 mol %. As to an •-olefin, 1-butene is particularly preferred.

A propylene-ethylene-•-olefin copolymer (BB-1), comprising the constituent units derived from propylene, ethylene, and an •-olefin having 4 to 20 carbon atoms in the above-mentioned amounts, has good compatibility with a propylene-based copolymer (AA), and thus the solar cell sealing sheet obtained exerts sufficient transparency, flexibility, heat resistance, and scratch resistance.

The Third Thermoplastic Resin Composition and a Solar Cell Sealing Sheet

The third thermoplastic resin composition of the present invention comprises (AA) and (BB) in the following blending amount:
(AA) A propylene-based polymer of 1 to 95 parts by weight, preferably 5 to 80 parts by weight, and more preferably 10 to 50 parts by weight
(BB) A propylene-based copolymer of 5 to 99 parts by weight, preferably 20 to 95 parts by weight, and more preferably 50 to 90 parts by weight.
Here, the total of (AA) and (BB) is 100 parts by weight.

When the above-mentioned (AA) and (BB) are contained in the preferred range, the sheet formability is excellent and the solar cell sealing sheet obtained is improved in heat resistance, transparency, and flexibility, and thus it is suitable for the present invention.

In addition, the thermoplastic resin composition of the present invention composed of the above (AA) and (BB) is blended with a coupling agent as an adhesion promoter to a glass, a plastic material and the like, and it can be suitably used to obtain a solar cell sealing sheet for adhesion with a glass or a plastic material.

A coupling agent (Y) used in the present invention is not particularly restricted so far as it can improve adhesion of the layer comprising thermoplastic resin composition of the present invention with another layer containing a resin having a polar group, or with another layer containing such inorganic compounds as a metal or a glass in an amount of 50% by weight or more, but a coupling agent of a silane-type, titanium-type, and chrome-type is preferably used, though a silane-type coupling agent (silane coupling agent) is suitably used. Specific examples of the silane coupling agent, though there is no particular restrictions, include publicly-known silane coupling agent such as vinyl triethoxysilane, vinyl trimethoxysilane, vinyl tris(•-methoxyethoxysilane), •-glycidoxypropyl trimethoxysilane, •-aminopropyl triethoxysilane and the like. The amount of silane coupling agent is 0.1 to 5 parts by weight or preferably 0.1 to 3 parts by weight relative to total 100 parts by weight of the above (AA) propylene-based polymer and (BB) propylene-based copolymer.

The coupling agent may be grafted, by using an organic peroxide, with at least either one of (AA) or (BB) that constitutes the thermoplastic resin composition.

In this case, the amount of the coupling agent is preferably 0.1 to 5 parts by weight relative to total 100 parts by weight of the above (AA) propylene-based polymer and (BB) propylene-based copolymer. The use of the silane-grafted thermoplastic resin composition also affords adhesion properties to a glass or a plastic material equal to or greater than those obtained by the blend with a silane coupling agent.

Further, in the present invention, the following auxiliary agents can be also used as necessary. Specific examples of auxiliary agents include peroxy auxiliary agents such as sulfur, p-quinonedioxime, p,p'-dibenzoylquinonedioxime, N-methyl-N-4-dinitrosoaniline, nitrosobenzene, diphenylguanizine, trimethylolpropane-N,N'-m-phenylenedimaleimide and the like, or divinylbenzene, triallyl cyanurate (TAC), and triallyl isocyanurate (TAIC). Further, the examples include polyfunctional methacrylate monomers such as ethyleneglycol dimethacrylate, diethyleneglycol dimethacrylate, polyethyleneglycol dimethcrylate, trimethylolpropane trimethacrylate, allyl methacryate and the like, and polyfunctional vinyl monomers such as vinyl butyrate and vinyl stearate, and the others. Among them, triallyl cyanurate (TAC) and triallyl isocyanurate (TAIC) are preferred.

In the present invention, it is preferred that the above-mentioned auxiliary agent is used with the organic peroxide in the weight ratio (auxiliary agent/organic peroxide) of 1/30 to 20/1, and preferably 1/20 to 10/1.

The thermoplastic resin composition of the present invention may be crosslinked but preferably non-crosslinked. Here, the term "crosslinked" means that the MFR of the thermoplastic resin composition at 230° C. is 0.04 g/10 min or less.

Specific examples of the organic peroxides include, though there is no particular restriction, publicly-known compounds such as dilauroylperoxide, 1,1,3,3-tetramethylbutylperoxy-2-ethylhexanoate, dibenzoylperoxide, t-amylperoxy-2-ethylhexanoate, t-butylperoxy-2-ethylhexanoate, t-butylperoxyisobutyrate, t-butylperoxymaleic acid, 1,1-di(t-amylperoxy)-3,3,5-trimethylcyclohexane, 1,1-di(t-amylperoxy)cyclohexane, t-amylperoxyisononanoate, t-amylperoxy-n-octoate, 1,1-di(t-butylperoxy)-3,3,5-trimethylcyclohexane, 1,1-di(t-butylperoxy)cyclohexane, t-butylperoxyisopropylcarbonate, t-butylperoxy-2-ethylhexylcarbonate, 2,5-dimethyl-2,5-di(benzoylperoxy)hexane, t-amy-peroxybenzoate, t-butylperoxyacetate, t-butylperoxyisononanoate, t-butylperoxybenzoate, 2,2-di(butylperoxy)butane, n-butyl-4,4-di(t-butylperoxy)butyrate, methylethylketone peroxide, ethyl-3, 3-di(t-butylperoxy)butyrate, dicumylperoxide, t-butylcumylperoxide, di-t-butylperoxide, 1,1,3,3-tetramethylbutylhydroperoxide, acetylacetoneperoxide and the like.

The thermoplastic resin composition of the present invention may be blended with various kinds of other additives. Examples of such additives include an UV absorber that can prevent deterioration due to UV rays in the sun light, a light stabilizer, an antioxidants and the like.

Specific examples of the UV absorbers include a benzophenone-type such as 2-hydroxy-4-methoxybenzophenone, 2-2-dihydroxy-4-methoxybenzophenone, 2-hydroxy-4-methoxy-4-carboxybenzophenone, 2-hydroxy-4-N-octoxybenzophenone and the like, a benzotriazole-type such as 2-(2-hydroxy-3,5-di-t-butylphenyl)benzotriazole, 2-(2-hydroxy-5-methylphenyl)benzotriazole and the like, and a salicylate-type such as phenyl salicylate, p-octylphenyl salicylate and the like.

As the light stabilizers, a hindered amine-type is used. And as the antioxidants, a hindered phenol-type and a phosphite-type are used.

As the third thermoplastic resin composition of the present invention, the composition having the light transmittance (trans) of 86% or more, preferably 88% or more is preferably used, wherein the light transmittance is measured by using a press sheet with 0.5-mm thickness (the both surfaces of which are smooth by using, for example, a PET film (trade name "Lumiror", manufactured by Toray Industries, Inc.) and the like as a mold releasing film).

The third thermoplastic resin composition of the present invention has the melt flow rate (ASTM D1238, 230° C., load 2.16 kg) of usually 0.05 to 1000 g/10 min, preferably 0.1 to 900 g/10 min, and more preferably 0.5 to 800 g/10 min.

Further, in the third thermoplastic resin composition of the present invention, the melt tension (MT) is usually 0.5 to 10 g and preferably 1 to 10 g. Within these ranges, the moldability to form the solar cell sealing sheet of the present invention is excellent. Here, the melt tension (MT) is measured at 200° C. as the tensile force applied to a filament when a strand is pulled at a constant speed (10 m/min) by using a melt tension tester (manufactured by Toyo Seiki Seisaku-sho, Ltd., wherein the strand is extruded at the extrusion speed of 15 mm/min.

Into the third thermoplastic resin composition of the present invention, various kinds of other additives can be added within the range that does not impair the objects of the present invention. Examples for such additives include an UV absorber for preventing deterioration due to UV rays in the sun light, a light stabilizer, an antioxidant, a heat stabilizer, an antistatic agent, an anti-slipping agent, an anti-blocking agent, an anti-clouding agent, a transparent nucleating agent, a lubricant (silicon oil and the like), pigments, a dye, a plasticizer, an antiaging agent, a hydrochloric acid absorber and the like.

A Solar Cell Sealing Sheet and a Solar Cell

The solar cell sealing sheet of the present invention is the one having the thickness of, for example, 0.1 mm to 3 mm and comprised of the third thermoplastic resin composition. When the thickness is below this range, damage to a glass or a solar cell module tends to take place during lamination process, and thus it is undesirable. When the thickness is above this range, the light transmittance and the photovoltaic power generation become poor, and thus it is undesirable.

The forming method to produce the solar cell sealing sheet of the present invention is not particularly restricted, and a publicly-known extrusion molding (such as a cast molding, extrusion sheet molding, inflation molding and injection molding), a press molding, a calendar molding and the like can be used. Further, the sheet can be embossed, by which its surface is decorated so that blocking of sheets with each other is prevented. In addition, a damage to a glass or a solar cell module can be prevented during lamination since the embossing can work as a cushion to these materials.

A power module laminated with the solar cell sealing sheet of the present invention on one and/or both side(s), in which a surface protection layer is laminated on the outer surface of the solar cell sealing sheet as necessary, can be used as a solar cell. One exemplary embodiment for the application of the solar cell sealing sheet is shown in FIG. 5.

The forming method for a solar cell is not particularly restricted, and for example, it can be obtained by laminating a surface protection layer, a solar cell element, and a solar cell sealing sheet of the present invention in turn, and then hot-pressing them, for example, by aspiration under vacuum and the like.

A surface protection layer used for the front and back surfaces of the solar cell sealing sheet of the present invention is not particularly restricted, and a publicly-known material can be used so long as it can protect the layer composed of a solar cell and a solar cell sealing sheet, and does not impair the objects as the solar cell. Specific examples of materials for surface protection layer include not only a glass but also such materials as a polyethylene resin, a polypropylene resin, a cyclic polyolefin resin, an AS (acrylonitrile-styrene) resin, an ABS (acrylonitrile-butadiene-styrene) resin, a polyvinyl chloride resin, a fluorinated resin, polyester resins such as polyethylene terephthalate, polyethylene naphthalate and the like, a phenolic resin, a polyacryl-type resin, polyamide resins such as various kinds of nylons, a polyimide resin, a polyamide-imide resin, a polyurethane resin, a cellulosic resin, a silicone-type resin, a polycarbonate resin and the like. They can be used in a combination of plural kinds. In addition, with the aim to improve permeation barrier to gases and water, an inorganic/organic composite film that is vapor-deposited with an inorganic oxide etc. can be also preferably used.

In order to improve the adhesion strength between a surface protection layer and a solar cell sealing sheet of the present invention, and between plural surface protection layers themselves, a publicly-known adhesive and an adhesive resin layers can be provided. In addition, depending on the embodiment of the solar cell of the present invention, one side of the surface protection layer may have light shielding/light reflecting properties.

EXAMPLES

The present invention is explained in more detail by the following Examples.
Evaluation Items
1. MFR MFR was measured at 190° C. or 230° C. under a load of 2.16 kg in accordance with ASTM D1238.
2. Transparency (Trans)

The measurement was performed in cyclohexanol by using C light source of a digital haze meter (NDH-2000, manufactured by Nippon Denshoku Industries Co., Ltd.) for a press sheet (reference) and a sample press sheet (reheated) prepared in the method described in Examples. The trans value was calculated by the following equation.

Trans(%)=100×(amount of total transmitted light)/(amount of incident light)

3. Appearance (Presence or Absence of Cloudiness)

Presence or absence of cloudiness was confirmed by using the press sheet (reference) and the sample press sheet (reheated) prepared by the method described in Examples.

•: absence of cloudiness, •:slight presence of cloudiness, x: presence of cloudiness 4. Heat Resistance (Confirmation of Fluidity of Quasi Module)

A test sample for heat resistance prepared by the method described in Example was kept in an oven at 90° C. in the state of tilting at 60° against the horizontal plane for 1000 hours to evaluate the fluidity of a quasi module in the test sample for heat resistance.

5. Adhesiveness with a Glass (Adhesion Strength)

By using a sample for the glass adhesion test prepared by the method described in Examples, the adhesion strength with a glass was evaluated.

Raw Materials Used for the Present Invention:
Propylene-Based Polymers (A):
(A-1) A Metallocene Isotactic Propylene-Based Polymer (mPP)

A propylene-based polymer (registered trademark; WINTEC, brand name; WFX4T, manufactured by Japan Polypropylene Corp.) having the melting point of 125° C., MFR (230° C.) of 7 g/10 min, the Vicat softening temperature of 113° C., and the tensile modulus of 960 MPa was used.

(A-2) An Isotactic Propylene-Based Polymer (PP1)

A propylene-based polymer (brand name; F327, manufactured by Prime Polymer Co., Ltd.) having MFR (230° C.) of 7 g/10 min, the melting point of 140° C., the Vicat softening temperature of 123° C., and the tensile modulus of 1080 MPa was used.

(A-3) An Isotactic Propylene-Based Polymer (PP2)

A propylene-based polymer (brand name; F337D, manufactured by Prime Polymer Co., Ltd.) having MFR (230° C.) of 7 g/10 min, the melting point of 132° C., the Vicat softening temperature of 115° C., and the tensile modulus of 910 MPa was used.

(A-4) An Isotactic Propylene-Based Polymer (PP3)

A propylene-based polymer (brand name; XR-110T, manufactured by Mitsui Chemicals Inc.) having MFR (230° C.) of 7 g/10 min, the melting point of 110° C., the Vicat softening temperature of 85° C., and the tensile modulus of 380 MPa was used.

Propylene-Based Copolymers (B)
(B) Propylene-Butene-Ethylene Random Copolymer (iP-BER)

Ethylene content=14.0 mol %, 1-butene content=20 mol %, MFR (230° C.)=8.5 g/10 min, the melting point=not observed, the molecular weight distribution (Mw/Mn)=2.0, the Shore A hardness=38, the mm value=90%.

Meanwhile, the propylene-ethylene-1-butene copolymer used for the present invention was obtained by the following manner.

Into a 2000-mL polymerization equipment which was fully purged with a nitrogen gas, 917 mL of dry hexane, 90 g of 1-butene, and triisobutylaluminum (1.0 mmol) were charged at room temperature, then the inner temperature of the equipment was raised to 65° C., and propylene was charged till 0.77 MPa, followed by ethylene till 0.79 MPa to control the inner pressure. Then, dimethylmethylene(3-tert-butyl-5-methylcyclopentadienyl)fluorenylzirconium dichloride and a toluene solution of methylaluminoxane (manufactured by Tosoh Finechem Corp.) were mixed to obtain the toluene solution containing aluminum atom and zirconium atom at the ratio of aluminum atom/zirconium atom=300/1 (molar ratio). Then, the toluene solution was taken in such an amount that contains 0.002 mmol of zirconium atom (namely 0.6 mmol of aluminum atom was contained), and was charged into the polymerization reactor, then the polymerization was carried out for 20 minutes at the inner temperature of 65° C. with maintaining the inner pressure at 0.79 MPa with ethylene. The polymerization was terminated by adding 20 mL of methanol, the reactor was depressurized, then the polymer was precipitated from the polymerization solution in 2 L of methanol, and then it was dried at 130° C. under vacuum for 12 hours. The amount of the obtained polymer was 60.4 g.

(C) Ethylene-Vinyl Acetate Copolymer (EVA)

Density=950 kg/m$^3$, vinyl acetate content=28% by weight, MFR (190° C.)=15 g/10 min, melting point=71° C.

(M) Light stabilizer (HALS) Seesorb 102
(N) UV absorber Sanol 770
(X) Silane coupling agent (VMMS)
3-Methacryloxypropyltrimethoxysilane (VMMS), SZ-6030, manufactured by Dow Corning Toray Co., Ltd.
(Y) Organic peroxide (PH25B)
Dialkyl-type peroxide (Perhexa 25B, manufactured by NOF Corporation)
(Z) Auxiliary agent (TAIC)
Triallyl isocyanurate (TAIC) (trade name M-60 (TAIC content 60%), manufactured by Nippon Kasei Chemical Co., Ltd.) of 0.2 part by weight (namely 0.12 part by weight as the TAIC content)

TABLE 1

Physical properties of each propylene-based polymer (A) used for Examples

| | | Unit | (A-1)mPP | (A-2)PP1 | (A-3)PP2 | (A-4)PP3 |
|---|---|---|---|---|---|---|
| Melting point | Tm | ° C. | 125 | 140 | 132 | 110 |
| Endotherm(140° C. or more) | •H(>140° C.) | Presence/Absence | Absence | Presence | Presence | Absence |
| Parameter 1 | $0.234 \times (Tm)^{1.277}$ | | 111.4 | 128.8 | 119.5 | 94.6 |
| Vicat softening temperature | Tv | ° C. | 113 | 123 | 115 | 85 |
| Parameter 2 | $0.902 \times (Tm)^{1.011}$ | | 118.9 | 133.3 | 125.6 | 104.5 |
| Tensile modulus | Ym | MPa | 960 | 1080 | 910 | 380 |
| D1 | | mW | 5.61 | 4.83 | 4.78 | 2.39 |
| D2 | | mW | −0.11 | 4.49 | 0.32 | −0.05 |
| D2/D1 | | | −0.02 | 0.93 | 0.07 | −0.02 |

Methods for Measuring Physical Properties of the Above-Mentioned Raw Materials (1) Melting Point and Confirmation of Presence or Absence of the Endotherm at 140° C. or More 1-1) Melting Point From the measured exothermic and endothermic curves, the maximum melting peak temperature during heating was taken as Tm. The measurement was performed as follows: after a sample was packed in an aluminum pan, (i) it was heated to 200° C. at a heating rate of 100° C./min and kept at 200° C. for 5 minutes, (ii) cooled to −150° C. at 20° C./min, and then (iii) heated to 200° C. at a heating rate of 20° C./min. The temperature at the endothermic peak observed in the above (iii) was taken as Tm.

1-2) Confirmation of Presence or Absence of the Endotherm at 140° C. or More (see FIG. 1)

Dried alumina packed in the same aluminum pan as the one described above in 1-1) was prepared as the reference, and then the vertical axis value (heat quantity) of the endothermic curve in (iii) obtained by the measurement according to the conditions of the above-mentioned 1-1) was taken as follows.

$D_{top}$=the vertical axis value at the peak position of melting point (maximum melting point)

$D_{140}°$ C.=the vertical axis value at 140° C.

$D_{150}°$ C.=the vertical axis value at 150° C.

From these values, D1 and D2 defined as below were calculated to confirm whether they satisfy Equation (1) or not.

$$D1 = D_{top} - D_{150}° C.$$

$$D2 = D_{140}° C. - D_{150}° C.$$

$$D2/D1 \leq 0.05 \qquad \text{Equation (1)}$$

(2) Contents of Comonomers (Ethylene, 1-Butene)

They were measured by the $^{13}$C-NMR spectrum analyses.

(3) MFR

MFR was measured at 190° C. or 230° C. under a load of 2.16 kg in accordance with ASTM D1238.

(4) Vicat Softening Temperature

The measurement was performed in accordance with ASTM D1525.

(5) Density

The density was measured in accordance with the method described in ASTM 1505.

(6) Shore A Hardness

A sample sheet with 2 mm thickness was kept at room temperature for 48 hours after the measurement, then it was contacted with a push pin of A-type instrument to read the scale immediately (in accordance with ASTM D2240).

(7-1) Tensile Modulus (a Propylene-Based Polymer (A))

The measurement was performed at 23° C. with the chuck distance of 80 mm and tensile rate of 200 mm/min by using a dumbbell in accordance with JIS K7113-2. The sample for the measurement was the press sheet that was obtained by hot-pressing a sample at 190° C. between the upper and the lower SUS molds with 4-mm thickness, then rapidly cooling it with a cooling chiller of 20° C. for molding, then leaving it for 72 hours or longer.

(7-2) Tensile Modulus (a Propylene-Based Copolymer (B))

The measurement was performed at 23° C. with the span distance of 30 mm and tensile rate of 200 mm/min by using a JIS3 dumbbell in accordance with JIS K6301.

The sample for the measurement was the press sheet that was obtained by hot-pressing a sample at 190° C. between the upper and the lower SUS molds with 4-mm thickness, then rapidly cooling it with a cooling chiller of 20° C. for molding.

(8) Molecular Weight Distribution (Mw/Mn)

The measurement was performed by a Gel Permeation Chromatography (GPC) at the column temperature of 140° C. by using an o-dichlorobenzene solvent (mobile phase) (Mw; weight-average molecular weight, Mn; number-average molecular weight, relative to polystyrene standards). Specifically, the molecular weight distribution was measured by using a gel permeation chromatograph Alliance GPC-2000 manufactured by Waters Corporation in the following manner. Separation columns: two TSKgel GNH6-HT columns and two TSKgel GNH6-HTL columns, all having a column diameter of 7.5 mm and a column length of 300 mm; column temperature: 140° C.; mobile phase: an o-dichlorobenzene (Wako Pure Chemical Industries, Ltd.) containing 0.025% by weight of BHT (Takeda Pharmaceutical Co., Ltd.) as an antioxidant; moving rate: 1.0 mL/min; sample concentration: 15 mg/10-milliliters; injection volume: 500 microliters; detector: a differential refractometer; standard polystyrenes: polystyrene with Mw<1000 and Mw>4×10$^6$ manufactured by Tosoh Corp., and polystyrene with 1000≦Mw≦4×10$^6$ manufactured by Pressure Chemical Co.

Evaluation of Suitability for the Thermal Lamination at Low Temperature

Examples 1, 2, 3, and Comparative Examples 1, 2

The raw materials in the composition with a blend ratio as shown in Table 2 were simultaneously charged into a Labo Plastomill (manufactured by Toyo Seiki Seisaku-sho, Ltd.) and melt kneaded (heated at 190° C. for 3 minutes with agitation speed of 40 rpm) to obtain a thermoplastic resin composition. It was press molded (heated at 190° C. for 7 minutes and then cooled, using a Teflon (registered trade name) sheet (300·m thickness) as a mold releasing film) by using a press molding machine to obtain a press sheet (reference) with 0.5 mm thickness.

This press sheet (reference) was heated again at 150° C. or 160° C. for 10 minutes (in the same press mold as the one used at 190° C. for the molding of the first sheet, using a Teflon (registered trade name) sheet as a mold releasing film in the similar manner) by using a press molding machine to obtain a sample press sheet (reheated) with 0.5 mm thickness. The evaluation results of MFR, the light transmittance, and presence or absence of cloudiness are shown in Table 2.

Comparative Example 3

The raw material resin composition as shown in Table 2 was simultaneously charged into a Labo Plastomill (manufactured by Toyo Seiki Seisaku-sho, Ltd.) and melt kneaded (at 110° C. for 3 minutes with agitation speed of 40 rpm) to obtain a thermoplastic resin composition. The thermoplastic resin composition was press molded (at 120° C.) by using a press molding machine to obtain a press sheet (reference) with 0.5 mm thickness.

This press sheet was heated at 150° C. or 160° C. for 20 minutes by using the same press molding machine to obtain a sample press sheet (reheated) with 0.5 mm thickness. The evaluation results of MFR, the light transmittance, and presence or absence of cloudiness are shown in Table 2.

TABLE 2

|  |  |  | Example 1 | Example 2 |
|---|---|---|---|---|
| A-1 | mPP | % by weight | 20 | 50 |
| B | PBER | % by weight | 80 | 50 |
| C | EVA | % by weight |  |  |
| M | Light stabilizer | Parts by weight*[1] | 0.2 | 0.2 |
| N | UV absorber | Parts by weight*[1] | 0.1 | 0.1 |
| X | VMMS | Parts by weight*[1] | 0.5 | 0.5 |
| Y | PH25B | Parts by weight*[1] | 0.06 | 0.06 |
| Z | TAIC | Parts by weight*[1] | 0.02 | 0.02 |
| Reference | MFR | g/10 min | 29 | 27 |
|  | Light transmittance | % | 96 | 93 |
|  | Presence/Absence of Cloudiness | Eye judgment | ● | ● |
| Heated at 150° C.*[2] (atmospheric pressure) | MFR | g/10 min | 26 | 28 |
|  | Light transmittance | % | 95 | 93 |
|  | Presence/Absence of Cloudiness | Eye judgment | ● | ● |
| Heated at 160° C.*[2] (atmospheric pressure) | MFR | g/10 min | 26 | 28 |
|  | Light Transmittance | % | 96 | 92 |
|  | Presence/Absence of Cloudiness | Eye Judgment | ● | ● |

*[1]Parts by weight: blending amount relative to 100 parts by weight of the sum of components A to C.
*[2]10 minutes for Examples 1 and 2.

|  |  |  | Comparative Example 1 | Comparative Example 2 | Example 3 | Comparative Example 3 |
|---|---|---|---|---|---|---|
| A-2 | PP1 | % by weight | 20 |  |  |  |
| A-3 | PP2 | % by weight |  | 20 |  |  |
| A-4 | PP3 | % by weight |  |  | 20 |  |
| B | PBER | % by weight | 80 | 80 | 80 |  |
| C | EVA | % by weight |  |  |  | 100 |
| M | Light stabilizer | Parts by weight*[1] | 0.2 | 0.2 | 0.2 | 0.2 |
| N | UV absorber | Parts by weight*[1] | 0.1 | 0.1 | 0.1 | 0.1 |
| X | VMMS | Parts by weight*[1] | 0.5 | 0.5 | 0.5 | 0.5 |
| Y | PH25B | Parts by weight*[1] | 0.06 | 0.06 | 0.06 | 0.06 |
| Z | TAIC | Parts by weight*[1] | 0.02 | 0.02 | 0.02 |  |
| Reference | MFR | g/10 min | 26 | 27 | 25 | 15 |
|  | Light transmittance | % | 96 | 95 | 96 | 95 |
|  | Presence/Absence of Cloudiness | Eye judgment | ● | ● | ● | ● |
| Heated at 150° C.*[2] (atmospheric pressure) | MFR | g/10 min | 28 | 27 | 31 | No flow |
|  | Light transmittance | % | 86 | 90 | 89 | 95 |
|  | Presence/Absence of Cloudiness | Eye judgment | X | X | X | ● |
| Heated at 160° C.*[2] (atmospheric pressure) | MFR | g/10 min | 26 | 27 | 30 | No flow |
|  | Light Transmittance | % | 90 | 93 | 95 | 94 |
|  | Presence/Absence of Cloudiness | Eye Judgment | ● | ● | ● | ● |

*[1]Parts by weight: blending amount relative to 100 parts by weight of the sum of components A to C.
*[2]10 minutes for Comparative Examples 1 and 2 and Example 3, and 20 minutes for Comparative Example 3.

From the results shown in Table 2, it was confirmed that by using the thermoplastic resin composition of the present invention a transparent sheet with no cloudiness could be obtained even when heated at low temperature. Further, flowability of the resin was not impaired.

Evaluation of Heat Resistance and Glass-Adhesiveness

Example 11

An aluminum plate with 300·m thickness which is used as a quasi module was sealed between two press sheets (molded at 190° C.) with 0.5 mm thickness prepared by the method described in Example 1, and further a glass plate with 3 mm thickness and a PET film (white color) with 50·m thickness were laid on it and then laminated by heat (at 150° C. for 10 minutes, atmospheric pressure) to obtain a sample (FIG. 6) for the test of the heat resistance. Also a glass plate with 3 mm thickness and a press sheet with 0.5 mm thickness were laminated by heat (at 150° C. for 10 minutes, atmospheric pressure) to obtain a sample (FIG. 7) for the test of the adhesiveness to a glass.

The evaluation results of these are shown in Table 3.

Comparative Example 11

An aluminum plate with 300·m thickness which is used as a quasi module was sealed between two press sheets (molded at 140° C.) with 0.5 mm thickness prepared by the method described in Comparative Example 1, and further a glass plate with 3 mm thickness and a PET film (white color) with 50·m thickness were laid on it and then laminated by heat (at 150° C. for 10 minutes, atmospheric pressure) to obtain a sample (FIG. 6) for the test of the heat resistance. Also a glass plate with 3 mm thickness and a press sheet with 0.5 mm thickness were laminated by heat (at 150° C. for 10 minutes, atmospheric pressure) to obtain a sample (FIG. 7) for the test of adhesiveness to a glass.

The evaluation results of these are shown in Table 3.

TABLE 3

|  |  |  | Example 11 | Comparative Example 11 |
|---|---|---|---|---|
| A-1 | mPP | % by weight | 20 |  |
| A-2 | rPP | % by weight |  |  |
| B | PBER | % by weight | 80 |  |
| C | EVA | % by weight |  | 100 |
| M | Light stabilizer | Parts by weight[*1] | 0.2 | 0.2 |
| N | UV absorber | Parts by weight[*1] | 0.1 | 0.1 |
| X | VMMS | Parts by weight[*1] | 0.5 | 0.5 |
| Y | PH25B | Parts by weight[*1] | 0.06 | 0.06 |
| Z | TAIC | Parts by weight[*1] | 0.02 |  |
| Heat resistance | | Eye judgment | No flow | No flow |
| Glass-adhesion strength | | N/cm | 19 | 16 |

[*1]Parts by weight: blending amount relative to 100 parts by weight of the sum of components A to C.

From the results in Table 3, it was confirmed that the thermoplastic resin composition of the present invention had sufficiently good heat resistance for practical use without crosslinking that might cause impairing the fluidity, and in addition, the thermoplastic resin composition of the present invention had sufficiently good adhesion strength to a glass for practical use.

Examples 4 and 5, Reference Example 1

As propylene-based polymer (AA), the propylene-based polymer (A-5) was used in Examples 4 and 5 and the propylene-based polymer (A-6) in Reference Example 1.
Propylene-Based Polymers (AA)
(A-5) Metallocene Isotactic Random Polypropylene (mPP)
Melting point=125° C., MFR (230° C.)=7 g/10 min, Mw/Mn=2.1, ethylene content=4.6 mol %, mm=95% This propylene-based polymer (A-5) was obtained by copolymerizing propylene with ethylene in the presence of the metallocene catalyst comprising diphenylmethylene(3-t-butyl-5-methylcyclopentadienyl)(2,7-d i-t-butylfluorenyl)zirconium dichloride and methylaluminoxane.
(A-6) Isotactic Random Polypropylene (rPP)
MFR (230° C.)=7 g/10 min, melting point=140° C., Mw/Mn=4.8, mm=97%

The raw materials with a blend ratio as shown in Table were simultaneously charged into a Labo Plastomill (manufactured by Toyo Seiki Seisaku-sho, Ltd.) and melt kneaded (at 190° C. for 3 minutes with agitation speed of 40 rpm) to obtain a thermoplastic resin composition. It was press molded (heated at 190° C. for 7 minutes and then cooled, by using Lumiror (manufactured by Toray Industries, Inc., 100·m thickness) as a mold releasing film) to obtain a press sheet (reference) with 0.5 mm thickness.

This press sheet was further heated at 150° C. or 160° C. for 10 minutes (in the same press mold as the one used at 190° C. for the molding of the first sheet) to obtain a sample press sheet with 0.5 mm thickness. The evaluation results of MFR, light transmittance, and presence or absence of the cloudiness are shown in Table 4.

Comparative Example 4

The raw materials as shown in Table 4 were simultaneously charged into a Labo Plastomill (manufactured by Toyo Seiki Seisaku-sho, Ltd.) and melt kneaded (at 110° C. for 3 minutes with agitation speed of 40 rpm) to obtain a thermoplastic resin composition. It was press molded (at 140° C.) by using a press molding machine to obtain a press sheet (reference) with 0.5 mm thickness.

This press sheet was further heated at 150° C. or 160° C. for 20 minutes by using the same press molding machine as before to obtain a sample press sheet with 0.5 mm thickness. The evaluation results of MFR, light transmittance, and presence or absence of the cloudiness are shown in Table 4.

TABLE 4

|  |  |  | Example 4 | Example 5 | Reference Example 1 | Comparative Example 4 |
|---|---|---|---|---|---|---|
| A-5 | mPP | % by weight | 20 | 50 |  |  |
| A-6 | rPP | % by weight |  |  | 20 |  |
| B | PBER | % by weight | 80 | 50 | 80 |  |
| C | EVA | % by weight |  |  |  | 100 |
| M | Light stabilizer | Parts by weight[*1] | 0.2 | 0.2 | 0.2 | 0.2 |
| N | UV absorber | Parts by weight[*1] | 0.1 | 0.1 | 0.1 | 0.1 |
| X | VMMS | Parts by weight[*1] | 0.5 | 0.5 | 0.5 | 0.5 |

TABLE 4-continued

|   |   |   | Example 4 | Example 5 | Reference Example 1 | Comparative Example 4 |
|---|---|---|---|---|---|---|
| Y | PH25B | Parts by weight*[1] | 0.06 | 0.06 | 0.06 | 0.06 |
| Z | TAIC | Parts by weight*[1] | 0.02 | 0.02 | 0.02 |  |
| Reference | MFR | g/10 min | 29 | 27 | 26 | 15 |
|  | Light transmittance | % | 93 | 92 | 93 | 93 |
|  | Presence/Absence of cloudiness | Eye judgment | • | • | • | • |
| Heated at 150° C.*[2] (atmospheric pressure) | MFR | g/10 min | 28 | 28 | 28 | No flow |
|  | Light transmittance | % | 92 | 92 | 86 | 92 |
|  | Presence/Absence of cloudiness | Eye judgment | • | • | X | • |
| Heated at 160° C.*[2] (atmospheric pressure) | MFR | g/10 min | 29 | 28 | 26 | No flow |
|  | Light Transmittance | % | 93 | 91 | 90 | 92 |
|  | Presence/Absence of cloudiness | Eye Judgment | • | • | • | • |

*[1]Parts by weight: blending amount relative to 100 parts by weight of the sum of components A to C.
*[2]10 minutes for Examples 4 and 5 and Reference Example 1, and 20 minutes for Comparative Example 4.

From the results shown in Table 4, it was confirmed that by using the thermoplastic resin composition of the present invention, a transparent sheet with no cloudiness could be obtained even when heated at low temperature and non-crosslinked.

Evaluation of Heat Resistance and Glass-Adhesiveness

Example 41

An aluminum plate with 300·m thickness which is used as a quasi module, was sealed between two press sheets (molded at 190° C.) with 0.5 mm thickness prepared by the method described in Example 4, and further a glass plate with 3 mm thickness and a PET film (white color) with 50·m thickness were laminated by heat (at 150° C. for 10 minutes, atmospheric pressure) to obtain a sample (FIG. 6) for the test of the heat resistance, and a glass plate with 3 mm thickness and a press sheet with 0.5 mm thickness were laid on it and then laminated by heat (at 150° C. for 10 minutes, atmospheric pressure) to obtain a sample (FIG. 7) for the test of the adhesiveness to a glass.

The evaluation results are shown in Table 5.

Comparative Example 41

An aluminum plate with 300·m thickness which is used as a quasi module, was sealed between two press sheets (molded at 140° C.) with 0.5 mm thickness prepared by the method described in Comparative Example 4, and further a glass plate with 3 mm thickness and a PET film (white color) with 50·m thickness were laid on it and then laminated by heat (at 150° C. for 10 minutes, atmospheric pressure) to obtain a sample (FIG. 6) for the heat resistance test, and a glass plate with 3 mm thickness and a press sheet with 0.5 mm thickness were laminated by heat (at 150° C. for 10 minutes, atmospheric pressure) to obtain a sample (FIG. 7) for the test of the adhesiveness to a glass.

The evaluation results are shown in Table 5.

TABLE 5

|   |   |   | Example 41 | Comparative Example 41 |
|---|---|---|---|---|
| A-5 | mPP | % by weight | 20 |  |
| A-6 | rPP | % by weight |  |  |
| B | PBER | % by weight | 80 |  |
| C | EVA | % by weight |  | 100 |
| M | Light stabilizer | Parts*[1] by weight*[1] | 0.2 | 0.2 |
| N | UV absorber | Parts by weight*[1] | 0.1 | 0.1 |
| X | VMMS | Parts by weight*[1] | 0.5 | 0.5 |
| Y | PH25B | Parts by weight*[1] | 0.06 | 0.06 |
| Z | TAIC | Parts by weight*[1] | 0.02 |  |
| Heat resistance |  | Eye judgment | No flow | No flow |
| Glass-adhesion strength |  | N/cm | 19 | 16 |

*[1]Parts by weight: blending amount relative to 100 parts by weight of the sum of components A to C.

From the results in Table 5, it was confirmed that the thermoplastic resin composition of the present invention can exert sufficiently good heat resistance and glass adhesion strength for practical use.

What is claimed is:

1. A thermoplastic resin composition, prepared by a method comprising melt kneading a mixture of 1 to 95% by weight of a propylene-based polymer (A) and 5 to 99% by weight of a propylene-based copolymer (B), which is a copolymer of propylene and at least one α-olefin having 2 to 20 carbon atoms other than propylene, wherein the sum of (A) and (B) is 100% by weight, in the presence of an organic peroxide with a coupling agent (Y), wherein the amount of Y is 0.1 to 5 parts by weight relative to total 100 parts by weight of (A) and (B), and wherein (A) satisfies the following (i) and (ii), and (B) does not show a melting point as measured by a differential scanning calorimeter (DSC):
   (i) a melting point measured by a differential scanning calorimeter (DSC) method is in the range of 80 to 135° C.; and
   (ii) an endotherm attributable to crystal melting is not observed at 140° C. or more in the endothermic curve measured by a differential scanning calorimeter (DSC) method.

2. The thermoplastic resin composition according to claim 1, wherein the propylene-based polymer (A) further satisfies the following (iii):
  (iii) a melting point (Tm) measured by a differential scanning calorimeter (DSC) and Vicat softening temperature (Tv) measured in accordance with ASTM D1525 satisfy Equation (I)

$$0.234 \times (Tm)^{1.277} < Tv < Tm, \quad \text{Equation (1),}$$

wherein Tm is in the range of 80 to 135° C.

3. The thermoplastic resin composition according to claim 1, wherein the propylene-based copolymer (B) is a propylene-ethylene-α-olefin copolymer (B-1), which comprises 45 to 92 mol % of the constituent unit derived from propylene, 5 to 25 mol % of the constituent unit derived from ethylene, and 3 to 30 mol % of the constituent unit derived from an α-olefin having 4 to 20 carbon atoms, and has no melting point as observed by a differential scanning calorimeter.

4. The thermoplastic resin composition according to claim 1, wherein a melt flow rate of the composition at 230° C. is 0.05 g/10 min or more.

* * * * *